(12) United States Patent
Imada et al.

(10) Patent No.: US 7,288,203 B2
(45) Date of Patent: Oct. 30, 2007

(54) PROCESS FOR PRODUCING STRUCTURE, PROCESS FOR PRODUCING MAGNETIC RECORDING MEDIUM, AND PROCESS FOR PRODUCING MOLDED PRODUCT

(75) Inventors: Aya Imada, Atsugi (JP); Tohru Den, Setagaya-ku (JP); Tatsuya Saito, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 11/086,423

(22) Filed: Mar. 23, 2005

(65) Prior Publication Data

US 2005/0211663 A1    Sep. 29, 2005

(30) Foreign Application Priority Data

Mar. 23, 2004   (JP)   ............................. 2004-085014
Feb. 28, 2005   (JP)   ............................. 2005-053447

(51) Int. Cl.
*B44C 1/22*   (2006.01)
*G11B 5/706*   (2006.01)

(52) U.S. Cl. .................. 216/22; 216/102; 216/103; 428/846.4

(58) Field of Classification Search .............. 216/22, 216/102, 103; 428/846.4
See application file for complete search history.

(56) References Cited

U.S. PATENT DOCUMENTS 6,107,213 A * 8/2000 Tayanaka .................... 438/762

6,214,701 B1 * 4/2001 Matsushita et al. ......... 438/458

FOREIGN PATENT DOCUMENTS

JP    04319412 A   * 11/1992

OTHER PUBLICATIONS

Li, et al., "Hexagonal pore arrays with a 50-420 nm interpore distance formed by self-organization in anodic alumina", J. Appl. Phys., vol. 84, No. 11, 6023-6026 (1998).
Furneau et al., "The formation of controlled-porosity membranes from anodically oxidized aluminum", Nature, vol. 337, No. 6203, 147-149 (1989).
Masuda et al., "Fabrication of Gold Nanodot Array Using Anodic Porous Alumina as an Evaporation Mask", Japan, J. Appl. Phys., vol. 35, Part 2, No. 1B, 125-129 (1996).

* cited by examiner

*Primary Examiner*—Roberts Culbert
(74) *Attorney, Agent, or Firm*—Fitzpatrick, Cella, Harper & Scinto

(57) ABSTRACT

A process for producing a structure having a porous layer is provided. The process forms the porous layer with high thickness-controllability. The process comprises steps of preparing a layered product having, on a substrate, a first nonporous layer and a second nonporous layer different in constituting material composition from the first layer; anodizing the layered product to form pores in the first nonporous layer and the second nonporous layer; and removing the second nonporous layer having pores formed therein from the layered product.

8 Claims, 5 Drawing Sheets

PROCESS FOR PRODUCING STRUCTURE, PROCESS FOR PRODUCING MAGNETIC RECORDING MEDIUM, AND PROCESS FOR PRODUCING MOLDED PRODUCT

BACKGROUND OF THE INVENTION

1. Field of the Invention

The present invention relates to a process for producing a porous product having pores formed by anodization.

2. Description of the Related Art

For formation of a fine pore structure on a surface of an product, a known technique is an anodization process in which aluminum, silicon, or a like material is immersed as an anode in a solution, and is etched by application of an electric field to form fine pores of nanometers.

For example, an aluminum substrate is immersed in an acidic electrolyte solution such as an oxalic acid solution and a phosphoric acid solution, and an electric field is applied thereto to form a porous anodized film on the surface of the aluminum (R. C. Furneaux; W. R. Rigby; A. P. Davidson: NATURE, Vol.337, p147 (1989)). This porous film is characterized by a special structure having fine cylindrical pores of several to several hundreds of nanometers in diameter (alumina nanoholes) arranged at intervals of tens to hundreds of nanometers. The fine pores have a very high aspect ratio and are uniform in the diameter of the pore cross-section.

The intervals and aspect ratios of the pores of the produced pore structure can be controlled by the anodization conditions. Generally, the pore intervals are proportional to the applied voltage in the anodization; the pore depth is proportional to the anodization time length; and the pore diameter can be enlarged after the anodization by immersion of the alumina in an etching solution capable of uniform etching such as an aqueous phosphoric acid solution.

The nanoholes produced thus in alumina are random in the arrangement, and are irregular at and near the surface although they are perpendicular inside the aluminum film. To improve the irregularity, a two-step oxidation process is known (Japanese Journal of Applied Physics, Vol.35, part 2, No.1B, pp125-129 (1996)). In this process, the anodization is interrupted and the formed porous alumina film portion is removed, and then the anodization of the remaining alumina is continued further to form pores with high perpendicularity, straightness, and independency. After the removal of the porous film formed in the first anodization, pits are left on the surface of the alumina at the positions of the removed nanohole bottoms. These pits serve as the starting points of the pore formation in the second anodization. Therefore, the pore formation is started at the same time without disorder of perpenducularity of the pores at or near the film surface.

In another method, the pores are formed regularly spontaneously by etching for a long time under a certain anodization conditions called a self-regularization conditions (bath composition, bath temperature, applied voltage, etc.) (Journal of Applied Physics, p6023 (1998)).

However, in this method, for achieving a certain regularity, the aluminum film used should be sufficiently thick and be anodized for a long time.

The two-step anodization process as described above is excellent in that the pores can be formed by direct etching only with an intended pore interval and a high aspect ratio without conducting steps of resist application, light exposure, development, and the like, being different from conventional photolithography. Otherwise, a regular pore structure having uniform pore diameters can be formed in somewhat separated domains under self-regularization conditions.

However, in the two-step process, the anodization is interrupted once and the porous film having formed is removed. In this process, the final porous film thickness is not readily controllable.

SUMMARY OF THE INVENTION

The present invention intends to provide an improved process for producing a structure having a porous layer.

According to an aspect of the present invention, there is a process for producing a structure comprising steps of: preparing a layered product having, on a substrate, a first layer and a second layer different in constituent from the first layer; anodizing the layered product to form pores in the first and second layers; and removing the second layer having pores formed therein from the layered product.

At least one of constituents of the first layer or the second layer is preferably an aluminum alloy.

The aluminum alloy preferably contains aluminum at a content of not less than 50 atom %. Alternatively, the aluminum alloy preferably contains at least one element selected from the group constituting of Cr, Mg, Ti, Zr, Hf, Nb, Ta, Mo, and W.

The step of removing the second layer is preferably conducted by using an etchant which etches the second layer at a higher etching rate than that of the first layer.

The thickness of the second layer is preferably larger than the thickness of the first layer.

The substrate preferably has a curved shape, and the first layer is curved in accordance with the curved shape of the substrate.

According to another aspect of the present invention, there is provided a process for producing a molded product by using as a molding die a structure having a curved shape produced by the process for producing the structure wherein the first layer is curved in accordance with the curved shape of the substrate.

According to a still further aspect of the present invention, there is provided a process for producing a magnetic recording medium, comprising the steps in the above process for producing a structure and further comprising a step of filling a magnetic material in the pores formed in the first layer after the step of removing the second layer.

The process of the present invention produces a porous product with easier control of the film thickness than conventional processes.

DETAILED DESCRIPTION OF THE INVENTION

Figure 1:
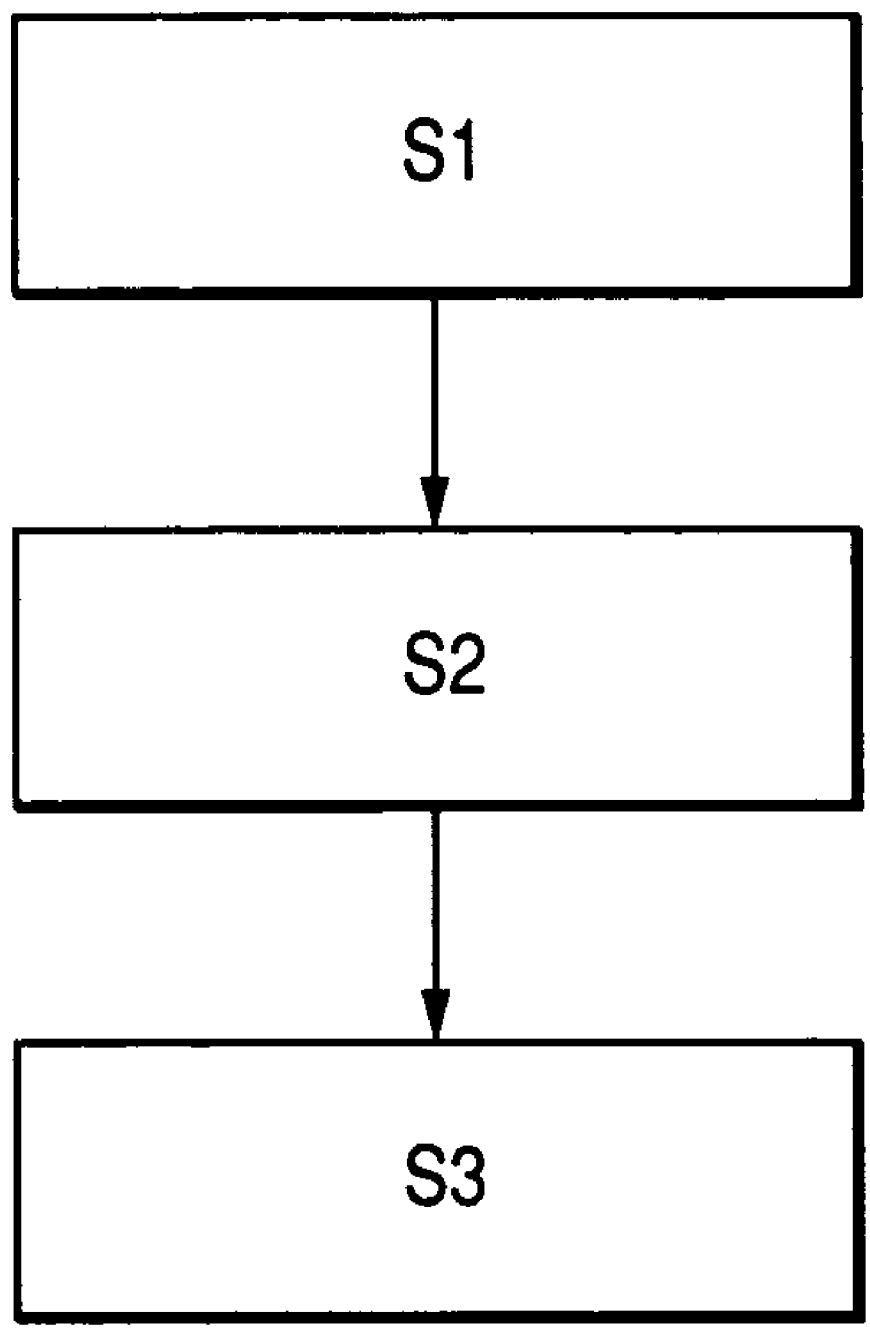
FIG. 1 is a flow chart for explaining the process of the present invention.

The present invention is explained specifically by reference to FIG. 1.

Firstly, a first nonporous layer and a second nonporous layer is laminated in the named order on a substrate to provide a layered product (S1).

Secondly, the first and second nonporous layers are anodized to form first and second porous layers (S2).

Then, the second porous layer is removed from the layered product (S3).

In the above steps, the thickness of the final porous layer is controlled by the thickness of the first nonporous layer of the layered product provided in the above step S1.

In the present invention, the constituting material of the first nonporous layer is different from that of the second nonporous layer to differentiate the etching rates of the first and second nonporous layers or of the first and second porous layers. Therefore, the second layer can selectively be removed when the second layer is made less chemical resistant than the first layer. The term "selectively" signifies that the second layer is removed selectively in comparison with the case where the first and second layers are made of the same material.

The removal of the second layer may be conducted by polishing or grinding.

At least one of the first nonporous layer and the second nonporous layer is preferably made of an aluminum alloy. The aluminum alloy contains aluminum at a content not less than 50 atom %, preferably not less than 80 atom %. The constituting material of the aluminum alloy contains, in addition to the aluminum, for example, at least one of the elements of Cr, Mg, Ti, Zr, Hf, Nb, Ta, Mo, and W.

The removal of the second layer is conducted by use of an etchant which is capable of etching the second layer at a higher rate than the first layer.

The first nonporous layer and the second nonporous layer are formed in the named order on the substrate in the present invention. However, an additional layer may be provided between the substrate and the first nonporous layer. The second nonporous layer is preferably thicker than that of the first nonporous layer: more preferably the thickness of the second nonporous layer is not less than twice that of the first nonporous layer.

When the substrate has a curved face and the aforementioned first nonporous film is formed on the curved face, the nonporous film itself is formed in a curved shape in accordance with the face shape of the substrate. Thereby, a curved porous layer is formed on the substrate. This structure is useful for molding an product. For example, in production of a lens, by use of a structure of the present invention as a molding die, a lens can be formed which has fine projections of nanometers on the surface. Such a layer having fine projections can serve as an anti-reflection layer.

A magnetic recording medium can be provided by filling, after removal of the second layer, a magnetic material into the pores formed in the first layer. This magnetic recording medium can be used in a vertical type magnetic recording apparatus in combination with a driving assembly for driving the magnetic recording medium, a head for reading or recording magnetic information, a driving assembly for driving the magnetic head, and so forth.

The present invention is explained below more specifically by reference to FIGS. 2A to 2E showing sectional views of the structure.

The process for production of a structure of the present invention comprises steps of forming, on supporting substrate 3, first film 1 comprised of a material as the main component capable of being anodized for pore formation (FIG. 2A); forming second film 2 comprised of another material as the main component capable of being anodized for pore formation, different from the material of the first film, on the first film 1 (FIG. 2B); immersing these films in an acidic solution and anodizing the first film and second film as an anode continuously (FIGS. 2C and 2D); and removing the resultant porous second film 6 (FIG. 2E) to form a porous structure. Incidentally, the resultant porous first film may be bared as necessary with the porous second film not entirely removed.

The above term "main component" signifies an element contained at the highest content.

Figure 2A:
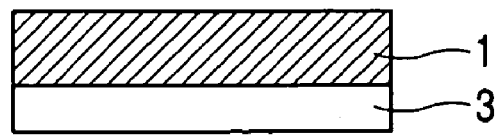
FIGS. 2A, 2B, 2C, 2D and 2E are sectional views for explaining an example of the present invention.
Figure 2B:
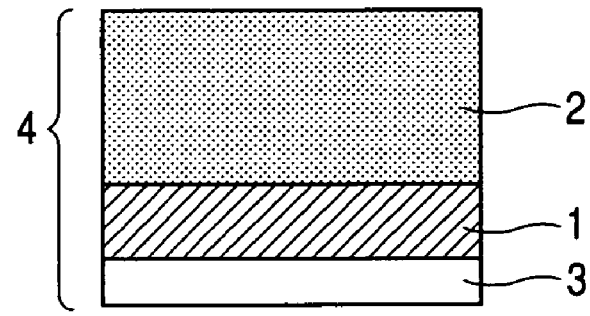
Figure 2C:
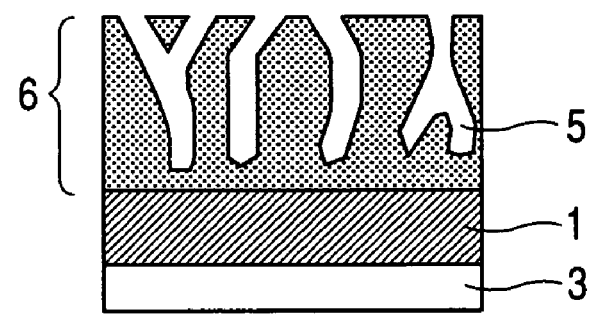
Figure 3A:
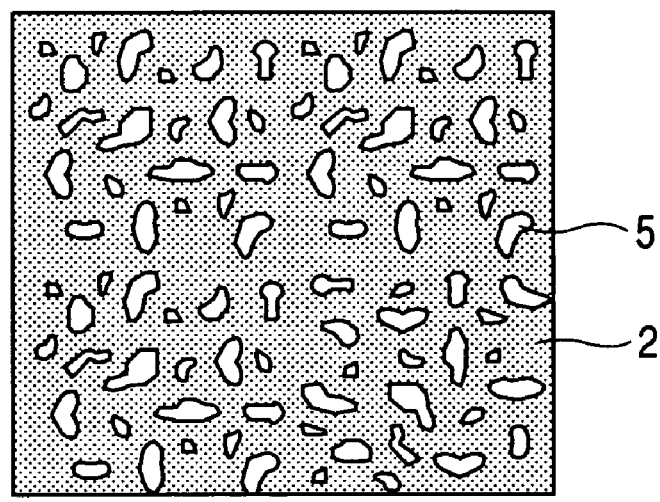
FIGS. 3A and 3B are plan views for explaining an example of the present invention.

In an example, on a substrate of silicon or glass as supporting substrate 3, the first film is formed by sputtering, vapor deposition, or a like technique from a material such as aluminum and silicon which is capable of being anodized to form pores (FIG. 2A); and thereon a metal film as the second film is formed similarly which is comprised of the material of the first film and an additional element like tungsten in an amount of several to several tens of percent (FIG. 2B). The layered films as an anode are anodized by applying a voltage in an acidic solution such as an aqueous sulfuric acid solution, an aqueous oxalic acid solution and an aqueous phosphoric acid solution to form pores at intervals of nanometers in the second film or to turn the second film into a porous second film (FIG. 2C). The intervals between the pores depend on the kind of the solution, the temperature, and the applied voltage in the anodization. For example, pores are formed at intervals of 100 nm in an aqueous oxalic acid solution at 16° C. by application of voltage of 40 V. At the beginning of the anodization, the pore formation starts from irregular surface of the second layer, in particular from recesses at the boundaries of grains (FIG. 3A). With the progress of the anodization into the interior of the second layer, the pore intervals come to an average interval corresponding to the above conditions.

The average interval between the formed pores is known to be generally in the relation below:

$$\text{Average interval [nm]} = \text{Applied voltage [V]} \times 2.5 \text{[nm/V]}$$

Figure 3B:
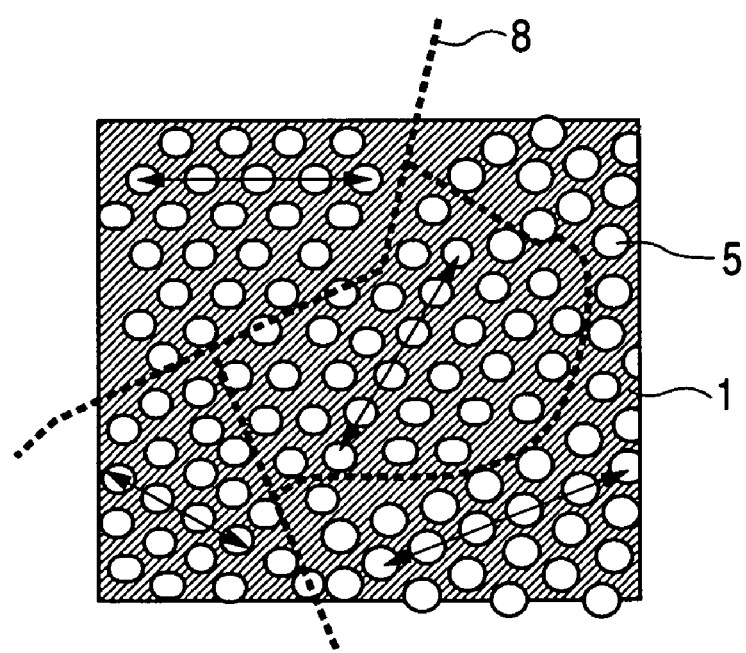

In particular, under the conditions called self-regulation conditions (or self-organization conditions), with progress of the anodization into the interior of the second layer, the pores comes gradually to be in a regular arrangement. FIG. 3B shows an arrangement of the pores resulting from the self-regularization. The aforementioned conditions of an aqueous oxalic acid solution, 16° C., and 40 V are well known as an example of the self-regularization conditions.

Figure 2D:
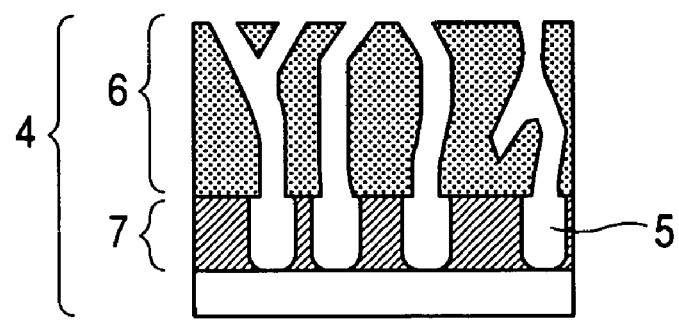
Figure 2E:

In the next step, only the porous second film is removed by immersion in a solution which is capable of dissolving preferentially the porous second film, for example in an aqueous phosphoric acid solution. Thereby the porous first film 7 is obtained which has an intended controlled thickness, and has self-regularized straight pores perpendicular to the supporting substrate (FIG. 2E, FIG. 3B). The porous first film 7 is constituted of an oxide of the first film.

The first film (first nonporous layer) or the second film (second nonporous layer) is made of a material which is susceptible to anodization to form pores. The material is preferably a metal containing aluminum at a content ranging from 50 atom % to 100 atom % for forming pores superior in perpendicularity.

The material susceptible to anodization to form pores includes metals containing at least one of the valve metals: Cr, Mg, Ti, Zr, Hf, Nb, Ta, Mo, and W. Use of the alloy of the above valve metals enables change of the diameter of the formed pores, and of the resistance to the aqueous acidic solution of the material. The process for producing such an alloy includes simultaneous sputtering with an aluminum target and a valve metal target, sputtering with an aluminum target having a valve metal chip placed thereon, and sputtering with a fired alloy target, but is not limited thereto. Naturally, a film-forming system other than a sputtering system may be employed.

The above valve metal is added to the aluminum at a content of preferably not lower than 5 atom %. However, in the amorphous region, the pores formed by the anodization become less perpendicular and less straight, which renders difficult formation of a porous film like a resultant of the anodization of aluminum film with high reproducibility. Therefore, the amount of the addition is generally in the range from 5 to 50 atom %, preferably from 10 to 20 atom % depending on the kind of the metal.

Figure 4A:
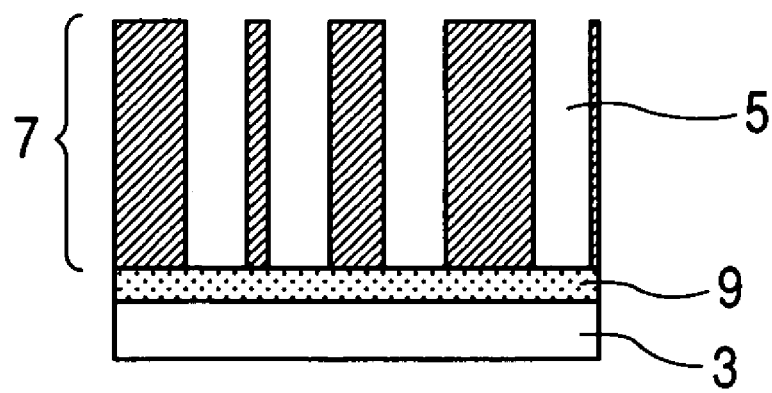
FIGS. 4A and 4B are sectional views for explaining an example of the present invention.
Figure 4B:
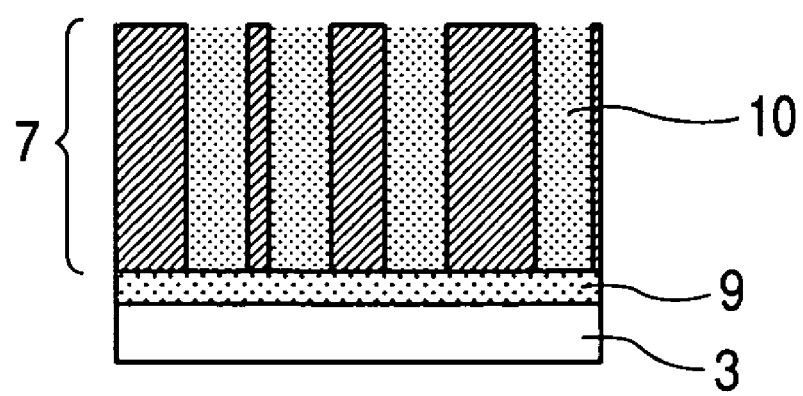

Under the first film, a Cu layer or a noble metal layer may be provided as electrode layer 9. In this constitution, pores can be formed to penetrate to this electrode layer with high reproducibility. Thus the pores penetrating to the electrode can be formed without causing exfoliation of the anodization film (FIG. 4A). With this structure, a substance can be filled into the pores by electrodeposition by utilizing the bared portions of the electrode layer as the electrode (FIG. 4B). The filler which is deposited outside the pore can be removed by grinding or a like method. The pores in the porous first layer have uniform depths and penetrate nearly at the same time, so that the exfoliation of the film is less liable to occur and the packing ratio of the material is high owing to the self-regularization of the pores. Further the diameters of the holes formed with self-regularization are uniform in comparison with randomly distributed pores. Therefore, the porous first film 7 peeled off from supporting substrate 3 is applicable as a filter or to like uses by utilizing the uniform penetrating pores.

Incidentally "high self-regularization degree" herein signifies that, in a certain thickness of the anodization, the area of the domain region of the regularized nanoholes is larger. The "domain region" herein signifies a region in which the nanoholes (fine pores) are arranged uniformly in one direction as shown by arrows in FIG. 3B.

EXAMPLES

Examples of the present invention are described below in detail by reference to drawings.

Example 1

In Example 1 of the present invention, a structure having fine pores is produced through the following steps: formation of first film 1 mainly composed of a material anodizable to form pores on supporting substrate 3; formation of second film 2 composed of a component different from that of the first film 1 on the first film 1; anodization of the first film and the second film to form pores; and removal of porous second film 6 by immersion in a solution which is capable of dissolving preferentially the porous second film 6 to bare porous first film 7.

Specifically in this Example, the pore formation is conducted as below.

On a surface of supporting substrate 3 of silicon, a film of an aluminum-titanium alloy (titanium: 6 atom %) of 200 nm thick is formed by sputtering (FIG. 2A). Thereon a film of an aluminum-tungsten alloy (tungsten: 24 atom %) of 1000 nm thick is formed (FIG. 2B). This workpiece 4 as an anode is etched electrolytically by anodization in an aqueous oxalic acid solution (0.3 mol/L, 16° C.) with voltage application of 40 V to form pores in a random arrangement at an average pore interval of 100 nm as shown in FIG. 2C and FIG. 3A. By further anodization, the pores reach the aluminum-titanium alloy layer to form a porous film constituted of an aluminum oxide-tungsten oxide layer and an aluminum oxide-titanium oxide layer having a sectional constitution as shown in FIG. 2D. On the surface of the aluminum-titanium alloy oxide, the pores are arranged as shown in FIG. 2D by self-regularization, and in the layer, pores formed are straight and perpendicular to the supporting substrate. The degree of the self-regularization is higher for the larger thickness of the upper aluminum-tungsten alloy layer. For achieving the self-regularized construction with usual aluminum, the second film should have a thickness of several to several tens of micrometers. However, in the aluminum-tungsten alloy (tungsten: 24 atom %), the pores formed have much less diameters than in aluminum, so that the self-regularization degree can be raised even with a thin film. Further, the diameters of the pores formed in the aluminum-titanium alloy (titanium: 6 atom %) are relatively smaller than the diameters in the aluminum.

The workpiece is then immersed in an aqueous phosphoric acid solution (0.3 mol/L, 25° C.) for 60 minutes. Thereby, the porous film of the aluminum-tungsten alloy oxide is removed by dissolution, whereas the porous film of the aluminum titanium alloy oxide is dissolved little to result in enlargement of the pore diameter, giving the structure as shown in FIG. 2E and FIG. 3B.

In this example, anodization operation need not be interrupted, being different from the conventional two-step anodization process. That is, the first and second nonporous layers (or films) can be anodized in one continuous anodization operation.

Example 2

On a surface of supporting silicon substrate 3, a platinum film is formed as electrode layer 9 in a thickness of 10 nm by sputtering. Thereon a film of an aluminum-titanium alloy (titanium: 6 atom %) of 200 nm thick is formed, and further thereon a film of an aluminum-tungsten alloy (tungsten: 24 atom %) of 1000 nm thick is formed in the same manner as in Example 1 to obtain workpiece 4. This workpiece is anodized under the same conditions as in Example 1, and the resulting porous film of aluminum oxide-tungsten oxide is removed. Thereby a pore construction of porous film of aluminum oxide-titanium oxide is obtained in which the pores are self-regularized, straight and perpendicular as shown in FIG. 4A with the pores 5 penetrating to the underlying platinum electrode layer owing to the presence of the platinum electrode layer.

The electroconductive layer constituting the bottoms of pores 5 enables filling of a material into the pores by electrodeposition or the like procedure. For example, nickel is electrodeposited in pores 5 of the workpiece by electroplating in a nickel electroplating bath and employing the bottom of the pores 5 as a cathode. Since plating baths are generally acidic or strongly acidic, the plating bath in this example is selected preferably from the ones which do not corrode the aluminum alloy oxide. For preventing exfoliation of the aluminum film, titanium may be deposited in a thin film of about 5 nm thick by sputtering as an underlayer of the aluminum film. Other than Ni, a magnetic material, a light-emitting material, or the like can be filled into the pores for use as a recording medium or an optical element.

Example 3

Figure 5A:
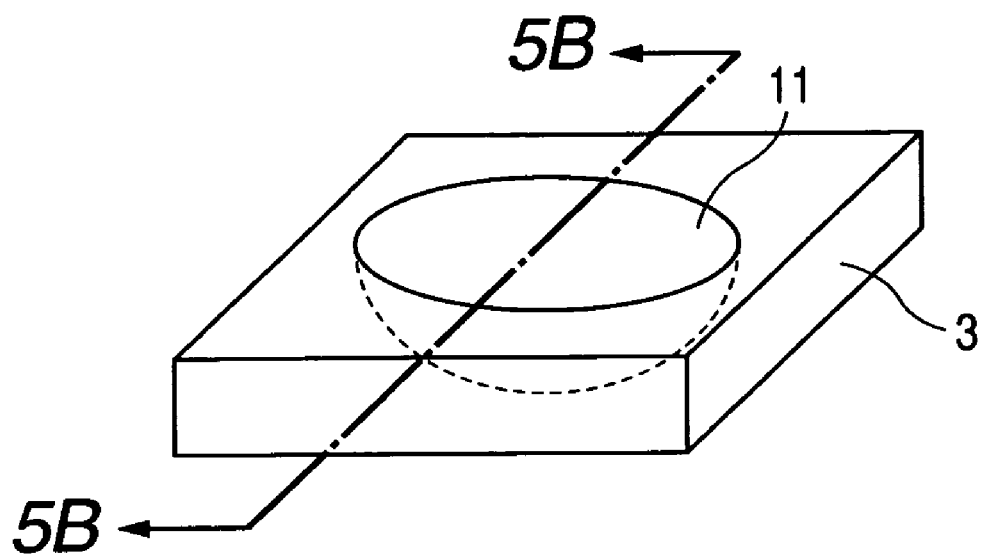
FIGS. 5A and 5B are drawings for explaining an example of the present invention.
Figure 5B:
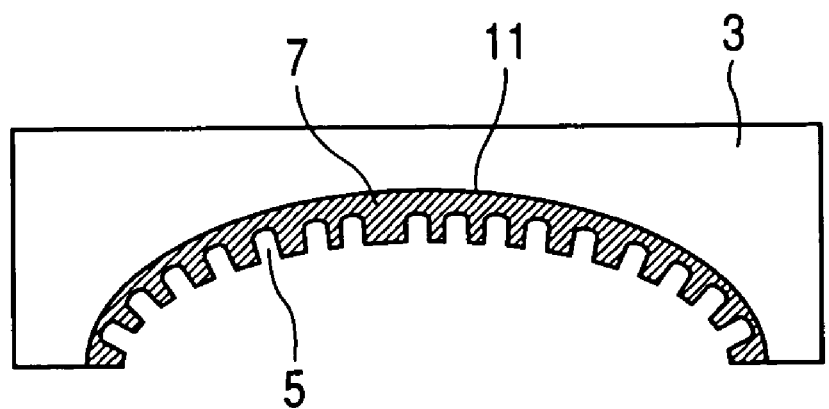

The surface of supporting nickel substrate 3 having a curved face 11 as shown in FIG. 5A is covered by sputtering with the same films as in Example 1: namely, a film of an aluminum-titanium alloy (titanium: 6 atom %, 200 nm thick) and a film of an aluminum-tungsten alloy (tungsten: 24 atom %, 1000 nm thick). The films are anodized and wet-etched under the same conditions as in Example 1 to form nanoholes having a depth of 100 nm. FIG. 5B shows a cross-sectional view of the formed structure taken along line 5B-5B in FIG. 5A.

By use of this structure as the molding die, a highly transparent resin is injection-molded to obtain a lens having projections having a height of about 100 nm at intervals of about 100 nm on the surface. The surface of this lens serves as an anti-reflection film, since light is scattered at a wavelength depending on the structure of the formed projections.

This application claims priority from Japanese Patent Application Nos. 2004-085014 filed Mar. 23, 2004, 2005-053447 filed Feb. 28, 2005, which are hereby incorporated by reference herein.

What is claimed is:

1. A process for producing a structure comprising steps of:
   preparing a layered product having, on a substrate, a first layer and a second layer different in constituent from the first layer, wherein at least one of constituents of the first layer or the second layer is an aluminum alloy;
   anodizing the layered product to form pores in the first and second layers; and
   removing the second layer having pores formed therein from the layered product.

2. The process for producing a structure according to claim 1, wherein the aluminum alloy contains aluminum at a content of not less than 50 atom %.

3. The process for producing a structure according to claim 1, wherein the aluminum alloy contains at least one element selected from the group constituting of Cr, Mg, Ti, Zr, Hf, Nb, Ta, Mo, and W.

4. The process for producing a structure according to claim 1, wherein the step of removing the second layer is conducted by using an etchant which etches the second layer at a higher etching rate than that of the first layer.

5. The process for producing a structure according to claim 1, wherein the thickness of the second layer is larger than the thickness of the first layer.

6. The process for producing a structure according to claim 1, wherein the substrate has a curved shape, and the first layer is curved in accordance with the curved shape of the substrate.

7. A process for producing a molded product by using as a molding die the structure produced by the process for producing a structure according to claim 6.

8. A process for producing a magnetic recording medium, comprising the steps set forth in claim 1 and further comprising a step of filling a magnetic material in the pores formed in the first layer after the step of removing the second layer.

* * * * *